United States Patent [19]

Harvey

[11] 4,277,747
[45] Jul. 7, 1981

[54] WIDE RANGE DIGITAL METER

[75] Inventor: Philip C. Harvey, Bedford, Mass.

[73] Assignee: MKS Instruments, Inc., Burlington, Mass.

[21] Appl. No.: 972,948

[22] Filed: Dec. 26, 1978

Related U.S. Application Data

[62] Division of Ser. No. 794,218, May 5, 1977, which is a division of Ser. No. 645,789, Dec. 31, 1975, Pat. No. 4,035,720.

[51] Int. Cl.³ .............................................. G01R 23/02
[52] U.S. Cl. ................................. 324/78 D; 324/79 D
[58] Field of Search ................. 324/78 D, 79 D, 186, 324/187; 179/175.2 A; 235/92 T

[56] References Cited

U.S. PATENT DOCUMENTS

| | | | |
|---|---|---|---|
| 3,876,867 | 4/1975 | Schull | 235/92 T |
| 3,997,740 | 12/1976 | Eubank | 324/79 D |
| 4,078,375 | 3/1978 | Kashio | 324/186 |
| 4,143,318 | 3/1979 | Harvey | 324/111 |

*Primary Examiner*—Michael J. Tokar
*Attorney, Agent, or Firm*—James E. Mrose

[57] ABSTRACT

In the ion gauge system disclosed herein, the ion current obtained from an ion gauge tube is directly converted to a signal having a frequency proportional to the ion current so that a digital measurement of vacuum may be obtained. The ion current charges an integrating capacitor which is periodically discharged after reaching a preselected threshold. Preferably, the threshold is adjusted in proportion to the ion gauge emission current so that automatic compensation for variation in the emission current is obtained, the output frequency being proportional to the ratio of the ion current to the emission current. The variable frequency output signal generated by the integration and discharge process is counted by a scaling circuit which automatically changes the timing interval to provide the desired number of significant figures while incrementing the exponent value in a scientific notation display in keeping with the active time base.

1 Claim, 5 Drawing Figures

WIDE RANGE DIGITAL METER

This is a division, of application Ser. No. 794,218, filed May 5, 1977, which is itself a divisional of Ser. No. 645,789, filed Dec. 31, 1975, now U.S. Pat. No. 4,035,720.

BACKGROUND OF THE INVENTION

This invention relates to an ion gauge system and more particularly to an ion gauge providing a digital display operative over a pressure range of several decades.

In most ion gauge systems presently available, the ion current is measured by conventional analog techniques and, if a digital display is desired, the resultant analog voltage is then converted to a digital representation by conventional means, e.g. dual slope integration, voltmeter circuits, etc. In order to provide for range changing, the analog circuitry in such prior art systems has typically employed the switching in of resistors of different values so as to scale the output signal, the switching being either manual or automatic under the control of analog out-of-range detectors. If a digital display is then driven by the analog display, its scale factor must be switched in correspondence with the changing of the analog scale factor. As will be understood by those skilled in the art, such an approach leads to considerable complexity together with substantial cost owing to the need for a plurality of high-value precision resistors as well as elaborate sensing and switching circuitry.

Among the several objects of the present invention may be noted the provision of an ion gauge system in which ion current is directly measured by a method appropriate for digital scaling and display; the provision of such a system which will operate over a pressure range of several decades without elaborate analog out-of-range detection; the provision of such a system which is highly accurate and highly reliable and which is of relatively simple and inexpensive construction. Other objects and features will be in part apparent and in part pointed out hereinafter.

SUMMARY OF THE INVENTION

An ion gauge system in accordance with the present inventiion involves a conventional ion gauge tube which is energized so as to provide a controlled emission current and thereby generate an ion current which varies as a function of the gas pressure at the gauge tube. The ion current is applied to an integrating capacitor which is progressively charged thereby and a detector or threshold means is provided for repetitively discharging the capacitor back to a preset voltage whenever the capacitor voltage reaches a preselectable threshold level. Means are also provided for counting the operations of the discharging means over an appropriate time interval. As the frequency of operation of the discharging means is variable as a function of the ion current, the count obtained will be indicative of the gas pressure at the gauge. In the preferred embodiment, the threshold level at which the detector-controlled discharging means operates is varied as a function of the emission current of the gauge so as to provide automatic compensation for any variation in the emission current.

In accordance with another aspect of the invention, the counting apparatus includes an event counter having a plurality of stages essentially corresponding in number to the number of significant digits desired in the pressure measurement. The application of the variable frequency pressure signal to the event counter is controlled by a timer circuit having a plurality of decade counting stages driven in succession, each stage corresponding to a possible timing interval. The timing intervals thus differ from each other by decade orders of magnitude. Successively longer timing intervals are sequentially selected by a switching means until the event count reaches a preselected level within the then operative timing interval, the event count being terminated at the end of that interval. Accordingly, the state of the switching means when the event count is completed is indicative of the exponent of the decimal multiplier to be used in construing the significant figures accumulated in the event counter.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
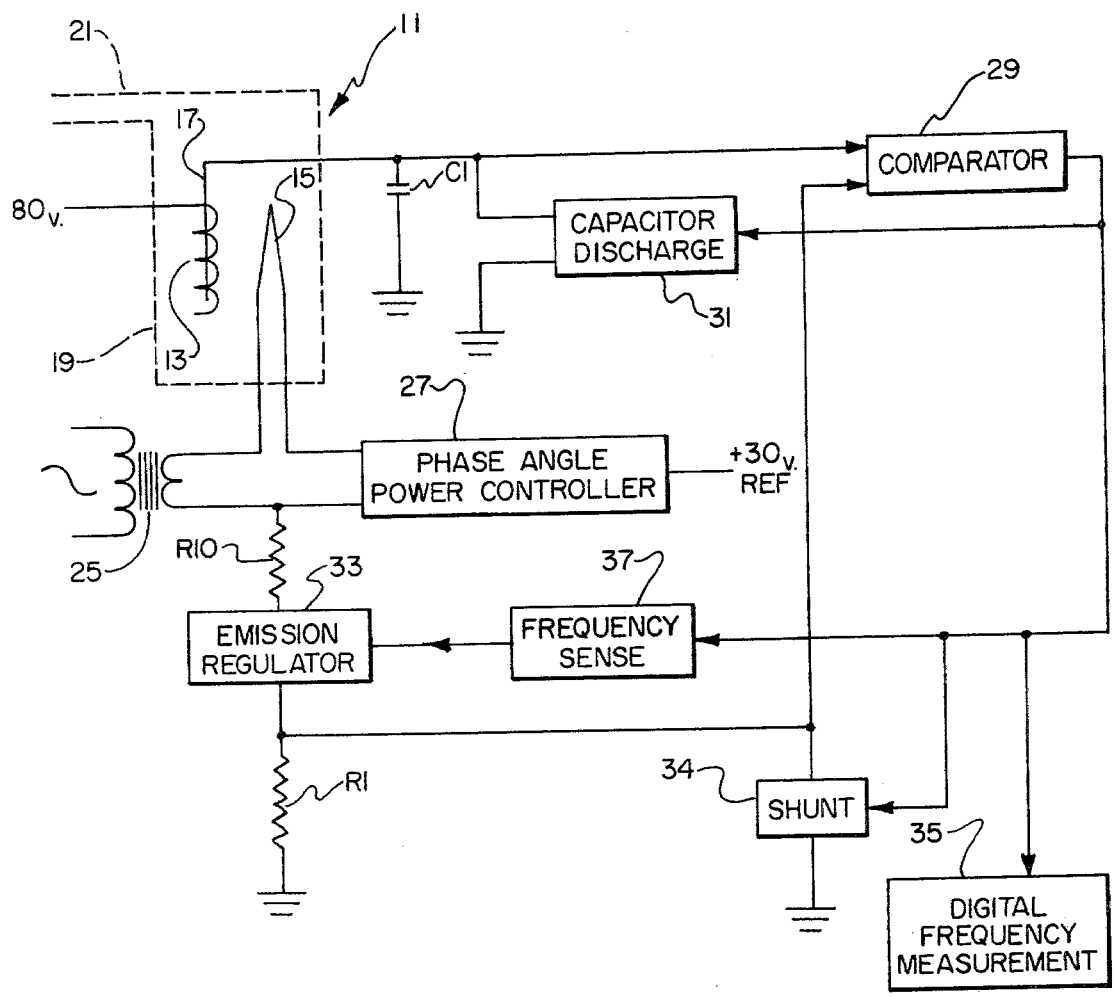
FIG. 1 is a block diagram illustrating the mode of operation of an ion gauge system constructed in accordance with the present invention.

Referring now to FIG. 1, a conventional ion gauge tube is indicated at 11. Such a tube is itself often referred to as an ion gauge. The ion gauge includes a helical wire anode 13 to which a relatively high positive voltage is applied for attracting electrons from a heated filament, indicated at 15. This electron current is conventionally referred to as the emission current in tube 11. A collector 17 is provided for collecting any ions which may be generated by the impingement of this electron current upon molecules of gas present in the tube. The tube further comprises a glass envelope 19 provided with an outlet or conduit 21 for connection to a vacuum system in which pressure is to be measured by the ion gauge system. As is understood by those skilled in the ion gauge art, the anode 13 may also be provided with connections (not shown) for providing a heating current to the helical wire element itself in order to effect out-gassing thereof.

Filament 15 is variably heated by a.c. current obtained from a filament transformer 25 through a phase-angle power controller 27, the controller being in series betwee the secondary of the filament transformer 25 and the filament itself. Emission current is conducted back to ground through a path comprising, in series, a pair of resistors R1 and R10 and an emission current regulator 33. As is understood, the collector 17 is operated at a negative voltage with respect to the other elements of the vacuum gauge tube in order to attract positive ions. In order to permit the ion current to be sensed with respect to system ground, the filament 15 is preferably operated at a nominal positive d.c. voltage, e.g. 30 volts. The controller 27 is responsive to the difference between the nominal d.c. potential of the filament and a 30 volt d.c. reference potential and modulates the power applied to the filament so as to maintain this difference near zero. Over most of the possible range of operation of the ion gauge system, the regulator 33 is fully conductive and the emission current is controlled at a constant or predetermined level. However, at high levels of ion current, a control signal is applied to the emission current controller 33, by a frequency sensing circuit 37 described hereinafter, to effect a gradual or progressive reduction of the emission current. While systems have been proposed heretofore for reducing emission current at higher pressure levels within the range of an ion gauge, such reductions have been stepwise, being introduced when the pressure exceeded a preselected threshold level.

As mentioned previously, the presence of gas molecules within the envelope 19 will result in positive ions being produced by the emission current and these ions will be drawn to the more negative collector 17. This ion current is applied to charge an integrating capacitor C1, the rate of charging of the capacitor being proportional to the ion current and thus also to the pressure within the envelope 19. The voltage on capacitor C1 is applied to a comparator circuit 29 which controls a discharge circuit 31 operative to discharge the capacitor each time the charge on the capacitor reaches a preselected voltage threshold. In accordance with one aspect of the present invention, the threshold level is varied in proportion to the emission current, the voltage across emission current sensing resistor R1 being applied as a second input to the comparator 29.

The appropriate capacitor discharge level is provided by means of a shunt circuit 34 which selectively shunts resistor R1 under the control of comparator 29, so that the threshold level at discharge is removed from the preselectable threshold by an amount equal to the emission current sense voltage. Since the amount of discharge is equal only to the difference between the emission sense voltage and zero (R1 unshunted and shunted), the amount of offset in the actual threshold voltages at C1 are of no consequence, and the system has none of the d.c. drifts associated with prior art systems, which require manual or automatic periodic adjustment.

Assuming that the discharge circuit 31 provides a relatively low impedance shunt path, so that the discharge interval for the capacitor C1 is relatively short in comparison with the charging interval, it can be seen that the interval between successive discharges will be inversely proportional to the ion current and proportional to the emission current. The frequency of operation will thus be essentially proportional to the ratio of ion current to emission current and hence also proportional to the gas pressure within the ion gauge tube 11. By digitally counting the variable frequency over an appropriate time interval, a measurement of pressure can thus be directly obtained over a large range of pressures. Such digital frequency measurement circuitry is indicated generally at 35 and is described in greater detail in connection with FIGS. 3, 4 and 5.

As indicated previously, it is known in the art to provide a stepwise reduction in emission current at high levels of ion current, i.e. in the presence of a relatively high pressure within the ion gauge tube 11. In the apparatus of the present invention, a continuous or progressive reduction in emission current is provided by applying a feedback signal to the emission current regulator 33. This feedback signal is generated by a frequency sensing circuit 37 responsive to the variable frequency output signal from the comparator 29. While this reduction in emission current reduces the gauge factor of the ion gauge tube, it should be understood that this progressive reduction in gauge factor does not affect the accuracy of pressure measurement since the charging of the integrating capacitor C1 by the ion current is measured with respect to a variable threshold which is responsive to the actual emission current. Thus, the output frequency of the system remains proportional to pressure even though the emission current and the gauge factor may vary significantly at relatively high values of pressure.

Figure 2:
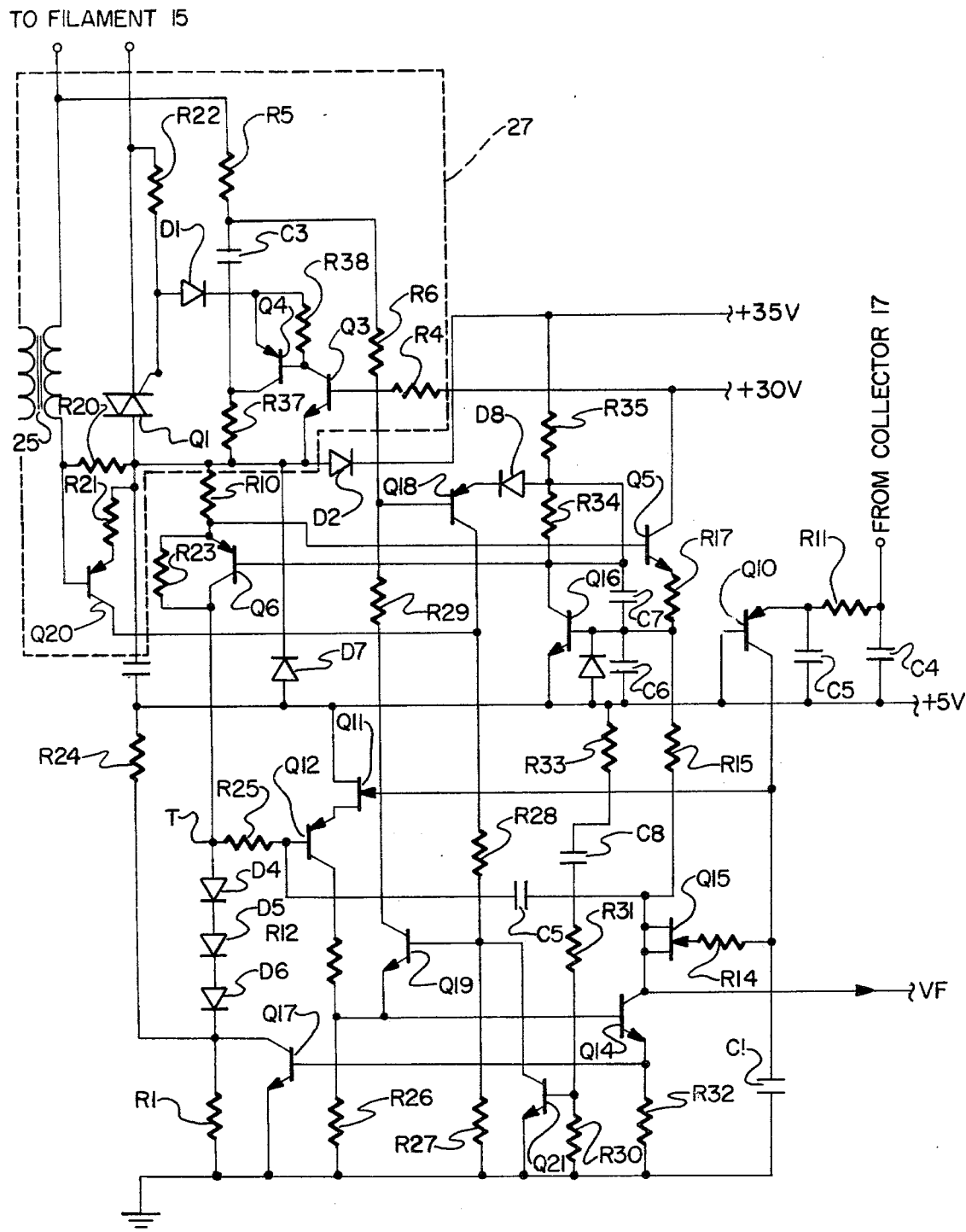
FIG. 2 is a schematic circuit diagram of analog emission current control circuitry and variable frequency signal generating circuitry employed in the apparatus of FIG. 1.

As suggested, the representation in FIG. 1 is somewhat simplified in order to facilitate an overall explanation of the basic mode of operation of the system. A presently preferred construction of the analog portion of the system in FIG. 1 is illustrated in FIG. 2. The filament power controller portion of the circuitry, again indicated at 27, employs a triac Q1 in series between the filament 15 and the secondary in the filament transformer 25. A nominal d.c. potential of $+30$ volts is maintained on this portion of the circuit by varying the energization of the filament as a function of emission current. The resistor performing the emission current sensing function is indicated as R10. Over most of the range of the instrument the potential at the base terminal of transistor Q6 is maintained at approximately $+5$ volts so that the lower end of resistor R10 may also be assumed to be at that potential.

A complementary pair of transistors Q3 and Q4 are interconnected for controlling conduction through triac Q1. The $+30$ volt reference potential is applied to the base of transistor Q3 through resistor R4 while the emitter of this transistor is at the nominal potential of the filament circuit, i.e. the upper end of resistor R10. Thus, unless the emission current is generating approximately a 30 volt drop across the path to ground, the transistors Q3 and Q4 and the triac Q1 will be turned on or off to increase or decrease the heating of the filament. In order to cause this turn on to be continuous rather than abrupt, i.e. to effect a phase-angle power modulation, a phase-shifted a.c. component, derived from the a.c. filament voltage through a resistor R5 and capacitor C3, is mixed with the error voltage through a resistor R6.

The frequency responsive feedback signal, described previously with reference to FIG. 1, is introduced in the particular circuit through the operation of a transistor Q16. Conduction through resistor R15 tends to turn off transistor Q16 and therefore decreases the drive to the base of Q5 and thus also the emission current through resistor R10, thereby causing the phase-angle controller to reduce the power to the filament in order to maintain 30 volts d.c. at the filament.

Except when the rate sensing circuit comes into play and reduces the emission current, the base of transistor Q6 is maintained essentially at 5 volts potential and the emission current flowing through the resistor R10 in the emitter circuit of this transistor is at a maximum. The emission current is also transmitted, through the collector of transistor Q6, down through diodes D4–D6 to resistor R1 which is connected to ground. The signal developed across this resistor is used to determine the variable discharge of the integrating capacitor, as described in greater detail hereinafter.

The integrating capacitor itself is again indicated as C1. After filtering by a network comprising capacitors C4 and C5 and resistor R11, the ion current from collector 17 is applied, through a small-signal low-leakage transistor Q10, to the integrating capacitor. The voltage on capacitor C1 is applied, through a field-effect transistor Q11, to the emitter of a PNP transistor Q12 where the capacitor voltage is, in effect, compared with the voltage at a junction T. As will be seen by those skilled in the art, the voltage at this point is a function of the voltage developed across resistor R1, the voltage drop across the diode string D4–D6 being essentially fixed. As will be apparent hereinafter, the voltage at junction T is essentially the threshold voltage to which the capacitor C1 must be charged before being discharged, except for a fixed offset. The gate of the field-effect transistor Q11, being back-biased, will be essentially an open circuit so that the charging of capacitor C1 is not loaded or disturbed. When the voltage on the capacitor reaches the threshold level, the transistors Q11 and Q12 will start to conduct and this action will, through the resistor R12, tend to turn on a transistor Q14 which is connected so as to shunt and thereby discharge the integrating capacitor C1. As may be seen from the diagram, the collector of transistor Q14 is connected to the integrating capacitor through the channel-gate junction of a field-effect transistor Q15 as well as a current limiting resistor R14. Transistor Q15 operates merely as a low-leakage diode.

Regenerative feedback to provide hysteresis and to cause the capacitor C1 to be discharged by a predetermined amount is obtained by an NPN transistor Q17 which is driven from the emitter of transistor Q14 and which shunts the emission current sensing resistor R1. The threshold T is thus reduced by an amount equal to the emission current sense voltage, so that the discharge of capacitor C1 continues until this reduced threshold is reached. The discharge then ceases and the cycle begins again. Thus the amount of discharge (and therefore the required charge for each cycle) is made proportional to the emission current. Rapid switching is assured by a small capacitor C5 which provides transient regenerative coupling between the collector of transistor Q14 and the base of transistor Q12. The variable frequency output signal of the system is taken from the collector of transistor Q14 and is designated VF.

Summarizing briefly the operation of this portion of the circuitry, the ion current is coupled, through transistor Q10, to the integrating capacitor C1 to cause the capacitor to charge linearly with respect to time at a rate proportional to the pressure in the ion gauge tube 11. When the capacitor voltage reaches a threshold level (T) determined by the emission current, a discharging circuit (Q14) is triggered which discharges the capacitor C1 back to a predetermined level. It can thus again be seen that the output signal comprises a variable frequency pulse signal of which the frequency is proportional to the pressure in the ion gauge tube.

The frequency sensing function is provided by coupling a signal from the collector of the output transistor Q14, through a resistor R15, to the base of a NPN transistor Q16, the signal being filtered or integrated by a pair of capacitors C6 and C7 to yield a net d.c. current proportional to the output frequency. The collector of transistor Q16 drives the base of transistor Q6. Transistor Q16 is normally conductive or saturated over most of the dynamic range of the system so that the base of transistor Q6 is normally maintained near ground potential as previously described. At the higher frequencies corresponding to higher pressures, however, the current applied to the base of transistor Q16 tends to turn it off, causing the potential at the base of transistor Q6 to rise. Degenerative feedback allowing this change to occur continuously in a controlled manner is provided by transistor Q5 which applies, through its emitter and a resistor R17, a current which opposes the frequency-proportional current.

As the voltage at the emitter of transistor Q6 rises with increasing output frequency, the current through R10 necessary to maintain a +30 volt nominal d.c. potential at the filament drops. The power controller responds to this new requirement and accordingly reduces the power applied to the filament 15 through Q1, thereby also reducing the emission current under feedback control. As suggested previously, the parameters of this rate sensitive circuit are selected so that it comes into operation only at relatively high pressures, e.g. above $10^{-5}$ torr. In other words, for most of the range of this system, the voltage at the emitter of transistor Q6 is nearly equal to +5V and thus the filament power is dynamically regulated to maintain a constant or predetermined emission current as sensed by the constant voltage across resistor R10. Only at relatively high values of ion current (pressure) is the emission current reduced and then the reduction is gradual and continuous.

The circuit of FIG. 2 also incorporates a fault responsive latch circuit which shuts down the analog portion of the circuitry in the event of certain faults. This latch circuit comprises a pair of complementary transistors Q18 and Q19 connected in a positive feedback latching configuration. The base of transistor Q18 is connected to the 30-volt filament potential while its emitter is connected, through a diode D8, to a resistive voltage divider connected between a 35-volt reference potential and the collector of transistor Q16. When the analog circuitry is operating normally and the transistor Q16 is saturated, the transistor Q18 is turned off and the latch is inoperative. If, however, the frequency sensing circuit, after adjusting the emission current as far as is reasonable, continues to turn off the transistor Q16, the diode D8 will be forward-biased and the transistor Q18 will be turned on. The turning on of transistor Q18 also turns on transistor Q19 and the two transistors interact to latch each other into conduction. Conduction through these transistors applies current to the base of transistor Q14, thereby turning it into continuous conduction and cutting off both the output pulse signal and the filament power control through Q3.

If a fault condition cuts off all emission current (such as a burst of air in the vacuum system), the filament voltage will drop, also turning on Q18 and latching the system "off."

The fault latch can also be turned on by an over-current sensing transistor Q20. The base-emitter junction of transistor Q20 is connected across a resistor which is in series with the filament current. When the filament current exceeds a preselected level, e.g. twenty amperes, transistor Q20 is turned on momentarily. The collector of transistor Q20 is connected into the latch circuit and tends to turn on transistor Q19 which in turn causes the transistor pair Q18 and Q19 to latch into conduction. When the system is initially turned on, a pulse produced by the charging of a capacitor C8 turns on a transistor Q21 momentarily, assuring that the latch circuit will be initially nonconducting.

While not every connection and resistor in the circuit of FIG. 2 has been described in detail, those skilled in the art will readily perceive their effect and operation in the overall circuit, given the foregoing description. To further facilitate any such analysis, the values and types of the components used in a preferred embodiment are given in the following table.

TABLE

| | | |
|---|---|---|
| R20 | .02 | ohms |
| R37 | 10 | " |
| R1, R12, R26, R28, R33, R14, R25, R22 | 110 | " |
| R15, R33, R10, R21, R5, R38, R41, R42 | 2200 | " |
| R11, R30, R31, R27, R23, R4, R6, R34, R35, R17 | 33000 | " |
| C1, C5 | 200 | picofarad |
| C8, C3 | 15 | microfarad |
| C6, C7, C4, C5, C9, C10 | .1 | " |
| Q1 | TRIAC TIP 263 | |
| Q14, Q16 | TRANSISTOR 2N 4275 | |
| Q19, Q17, Q3 | TRANSISTOR 2N 2484 | |
| Q4, Q18, Q10, Q20, Q6 | TRANSISTOR 2N 4249 | |
| Q12 | TRANSISTOR 2N 4258 | |
| Q15 | TRANSISTOR E 305 | |
| D1 thru D7 | DIODE 1N 2071 | |

The circuitry shown in FIG. 2 will operate to provide a pulse output signal which is accurately proportional to pressure over a range spanning some six decades, i.e. from $10^{-3}$ torr to $10^{-9}$ torr. In order to provide a meaningful measurement and display of such a wide range of pressures, the present invention contemplates a novel event counting circuit. This circuit is illustrated in FIG. 3.

As will be understood, an accurate frequency and therefore an accurate pressure measurement can be obtained by counting events, i.e. output pulses, over an appropriate length of time to achieve the desired number of significant figures. In the embodiment illustrated, it is assumed that it is desirable to have two significant decimal figures in the display, together with an exponent indicating the decade range in which the figures are to be construed. In order to contain the event count to the desired number of significant figures, the present invention provides a variable timing interval over which the count is accumulated.

Figure 3:
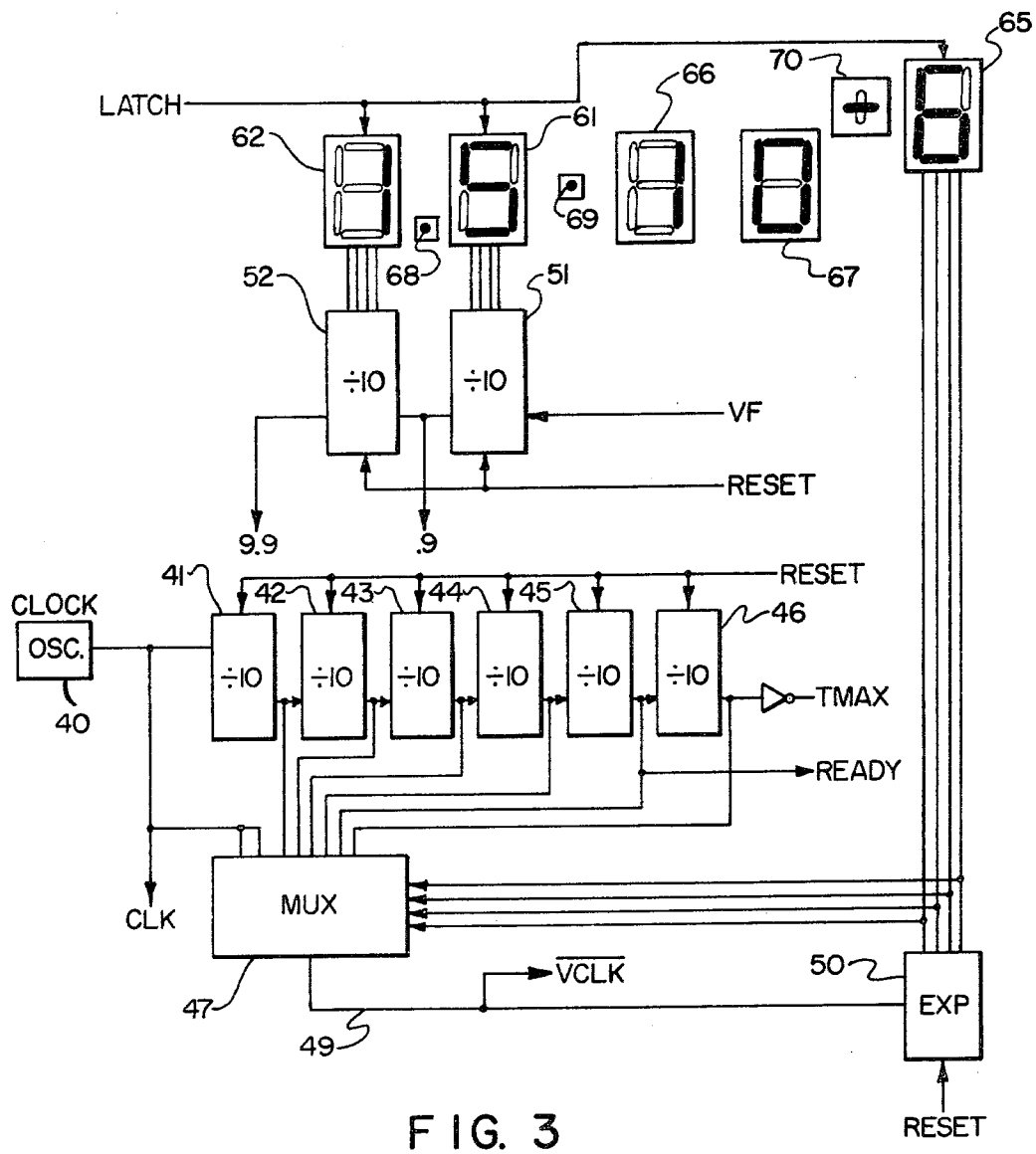
FIG. 3 is a logic diagram of digital event counting and timing circuitry employed for frequency measurement in the apparatus of FIG. 1.

Referring now to FIG. 3, an oscillator 40 acts as the system clock, providing output pulses at 2 microsecond intervals. This signal is designated CLK. A series of six decade-divider circuits 41-46 count down from the basic oscillator frequency to provide timing signals having periods ranging from 20 microseconds to 20 seconds, each timing signal differing in period from its predecessor by a factor of 10. The clock signal CLK and the several timing signals provided by the decade dividers 41-46 are applied to a multiplexer circuit 47 which selects one of these several signals, the selected signal being coupled to an output line 49. The output signal from the multiplexer is designated $\overline{VCLK}$ and is, in effect, a variable clock for the system.

The variable clock signal $\overline{VCLK}$ is applied to increment a counter 50 which may be considered to be the exponent counter. The binary coded signals representing the state of the counter 50 are applied as selection signals to the multiplexer 47. In other words, the state of the counter itself determines which of the timing signals may next cause the counter 50 to be incremented.

Figure 4:
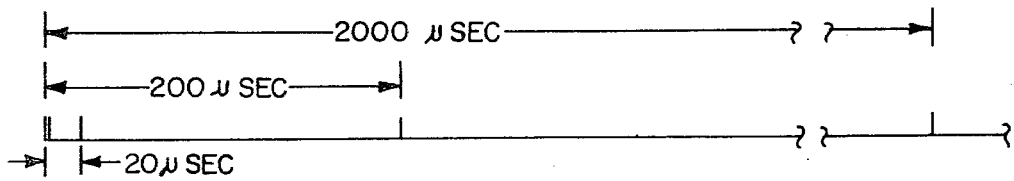
FIG. 4 is a timing diagram illustrating the operation of portions of the circuitry of FIG. 3.

Assuming that the increment counter 50 and the clock counters 41-46 are initially reset at the same time, it can be seen that the variable clock signal $\overline{VCLK}$ will comprise a succession of pulses derived as follows. As shown in the drawing, the clock signal CLK is applied to the first two inputs of the multiplexer 47. Thus, the counter 50 will be incremented from its ZERO state to its ONE state and then to its TWO state by the first two clock pulses. The counter 50 will then stay in this state until the first pulse is emitted by the output of the first timing counter 41, that is, after an interval corresponding to 10 clock periods. This advancing of the counter 50 will likewise shift the multiplexer 47 so that the counter 50 will then have to wait until an output pulse is generated from the second timing counter 42, i.e. 100 clock periods after the reset. This progression will continue with the inter-pulse interval growing by a factor of 10 between each of the successive pulses. This signal pattern is illustrated in FIG. 4. The purpose of having the exponent counter advance very quickly to its TWO state is that the particular apparatus illustrated is intended to gage pressures only lower than $10^{-3}$ torr. As is explained hereinafter, the counter 50 is incremented one last step as the counting interval is ended. Thus, the first timing period practical for considering the count acquired by the event counter is that (20 microseconds) corresponding to the maximum pressure range, i.e. the $10^{-3}$ torr pressure range.

The event counter itself comprises two successive decade counting stages 51-52 which are driven by the variable frequency signal VF generated by the analog circuitry of FIG. 2. Associated with each of the counting stages 51-52 is a display unit, e.g. of the seven segment type 61-62. The display units 61-62 are assumed to incorporate latch, decoding and driving circuitry so that each display can acquire a b.c.d. (binary coded decimal) value from the respective counter and provide a continuing decimal display of that value while permitting the counters themselves to be reset and proceed with a new counting sequence. A similar display unit 65 is provided for registering the value held in the exponent counter 50.

In order to provide a complete display appropriate for representing pressure in conventional units, the display preferably also incorporates a pair of seven segment display elements 66 and 67 constantly energized to represent a radix of ten; a decimal point indicator 68; a multiplier dot 69; and a negative sign 70 associated with the exponent display 65.

The carry signal from the counter 51 to the counter 52, designated 0.9, is employed to control the timing interval so as to achieve the desired number of significant digits in the display. This control operation is provided by the circuitry diagrammed in FIG. 5 but may be initially described in brief as follows. After all the counters are reset, the variable frequency pressure signal VF starts to advance the counting string 51-52. At the same time, the fixed frequency clock 40 starts to advance the timing string 41-46. If the carry signal 0.9 has not been generated and terminated (signifying that the number 1.0 has been counted) by the time the 20 microsecond timing interval is completed, the 20 microsecond timing signal will increment the exponent counter 50 so that the multiplexer will switch over to the 200 microsecond timing interval. Again, if the 0.9 carry signal has not yet indicated 1.0 at this point, the exponent counter 50 will again be incremented. This sequence of operations will continue until the end of the 0.9 signal does occur. The timing interval will then be concluded at the next VCLK clock pulse, at which time the data acquired by the counters 51-52 will be latched into the display units 61-62 and the exponent data will likewise be latched into the display 65. It mays be noted that this last variable clock pulse will increment the exponent counter 50 but this, being a consistent and predictable step, is accounted for in calculating the range factor of the instrument. After the latching of the data into the display units, the counters are again reset and the counting sequence reinitiated.

In order to allow for the possibility that the frequency of the output signal might change during a timing interval so that the last counting stage 52 would overflow, the carry signal from this counter, designated 9.9, is also provided to the control circuitry and used to initiate an immediate transfer of data to the display and resetting. In similar manner, the carry signal from the last clock divider 46, designated TMAX, is provided to the control circuitry to initiate a display latch and reset sequence if the maximum time interval runs out without achieving the desired number of significant figures.

Figure 5:
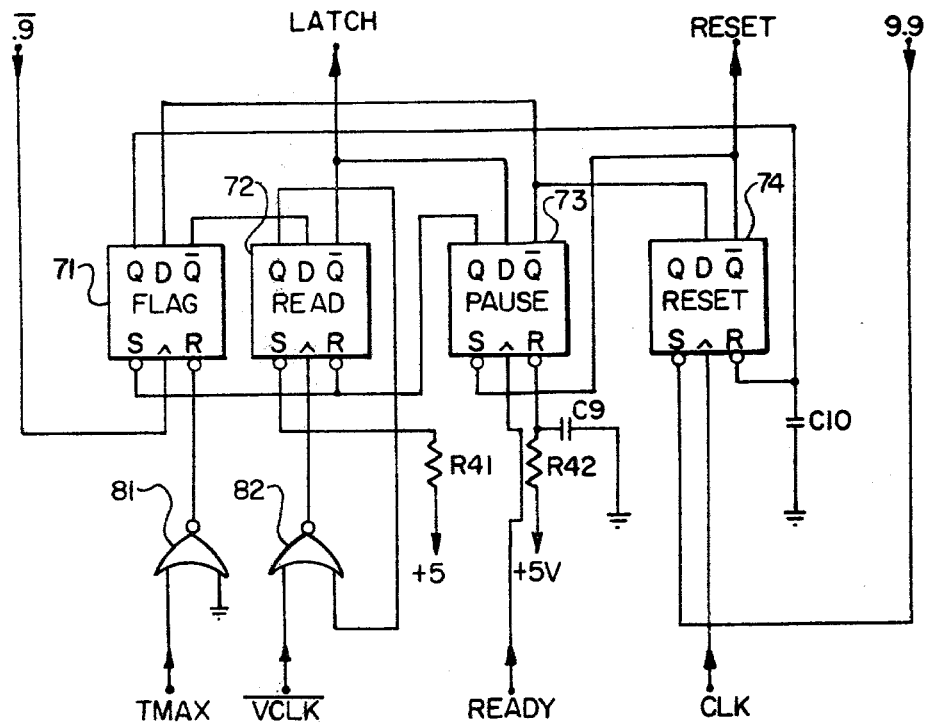
FIG. 5 is a logic diagram of control circuitry employed in the apparatus of FIG. 1.

The sequencer or control circuit which provides for this sequence of conditioned operations is illustrated in FIG. 5 and comprises four D-type flip flops 71–74 and two NOR gates 81–82, certain of which are operated merely as inverters. In following the detailed sequence of states through which the controller of FIG. 5 may pass, it is convenient to consider the four flip flops 71–74 as providing the functions of FLAG, READ, PAUSE, and RESET, respectively. Assuming that the PAUSE flip flop 71 has been reset, the occurrence of the 0.9 signal causes the FLAG flip flop 71 to be set. Once the FLAG flip flop has been set, the variable clock signal VCLK can cause the READ flip flop 72 to be set, which controls the latching of data into the display units. Once the READ flip flop 72 has been set, the PAUSE flip flop 73 can be set by the ready signal RDY which, as may be seen from FIG. 3, is taken from the next to the last counting stage of the clock string, i.e. the two second pulse interval signal. The provision of this delay insures that the display will not be updated so frequently that it is hard for the human eye to follow. Thus, even if the counting interval were terminated after 20 microseconds, a full two seconds would have to run out before the ready signal RDY was generated and the PAUSE flip flop was set. After the PAUSE flip flop is set, the RESET flip flop 74 can be triggered by the next clock pulse, generating the reset signal to all counters and restarting the sequence. The feedback from the Q output of the RESET flip flop 74 causes the PAUSE flip flop to be reset correspondingly which, in turn, re-establishes the initial state of the FLAG and READ flip flops.

Summarizing the overall operation of this apparatus, it can be seen that the analog circuitry of FIG. 1 operates to generate a variable frequency pulse signal with a repetition rate which is proportional to the ratio of ion current to emission current. This frequency is therefore proportional also to the pressure within the ion gauge. With the values set forth in Table I, this circuit will produce pulse rates from 0.05 HZ to 500,000 Hz corresponding to pressures in a typical gauge tube of about $10^{-10}$ to $10^{-3}$ torr. This variable rate pulse signal is applied to the event counting circuitry of FIG. 3 which advances from one possible count interval to the next until the desired number of significant figures are filled in the event counter. As the circuitry switches from one counting interval to the next, the exponent counter 50 in incremented so as to increment the range indicated in the display. As the frequency of the output signal from the analog circuitry varies in proportion to pressure, it can be seen that lower frequencies, requiring a longer counting interval, correspond to a lower pressure.

Thus, since the exponent is negative in the pressure ranges of concern, the increasing absolute value of the exponent is appropriate for decreasing ranges of expected pressure. It should be understood, however, that the event counting circuitry of FIG. 3 may have applications, beyond the ion gauge of the present invention, in which a positive exponent may be appropriate. In such a case the counter 50 may be of a type which will permit downward counting.

With this variable timing interval counting, a wide range of pressures can be accommodated without the usual complex circuitry ordinarily associated with autoranging systems. Despite its relative simplicity, however, the apparatus of the present invention is highly accurate over its wide range. The accuracy of the electronic measurement system can easily be more accurate than the reliability with which the scale factor of the ion gauge tube itself may be determined.

While the inherent sensitivity characteristics of the ion gauge tube itself, along with the values of the integrating capacitor C1 and emission sense resistor R1 will determine the actual frequency being generated by the analog circuitry for a given gas pressure, it should be noted that the pressure measurement registered for any given value of ion current may be scaled by varying the rate of the clock oscillator. Thus, for the purpose of calibrating a system initially being set up with a given ion gauge tube, the reading may be adjusted by varying the clock so as to correspond with a known reference pressure. Further, since there is no range-changing in the usual sense, the instrument will then be in calibration over its entire range, e.g. on the order of six or more decades.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. A wide range digital event per unit time meter comprising:
   a timing counter having a plurality of stages, successive ones of which are driven by the respective preceeding stages, each stage corresponding to a respective possible timing interval differing from the intervals of the adjacent stages by a predetermined factor;
   a clock pulse source for driving said timing counter;
   an event counter having a plurality of stages essentially corresponding in number to the number of significant digits desired in the final event count;
   gating means for selectively initiating the event counting by said event counter after resetting of said event and timing counters and for stopping the event counting upon the completion of a selected timing interval; and
   switching means, controlled by the timing counter and the event counter and operative at a predetermined point prior to the completion of each possible timing interval, for selecting the next longer timing interval if the event count has not reached a preselected level, the state of the switching means when the event count is completed being then indicative of the exponent of the radix by which the final event count should be multiplied.

* * * * *